(12) United States Patent
Chopra

(10) Patent No.: US 6,720,265 B2
(45) Date of Patent: *Apr. 13, 2004

(54) COMPOSITION COMPATIBLE WITH ALUMINUM PLANARIZATION AND METHODS THEREFORE

(75) Inventor: Dinesh Chopra, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/212,329

(22) Filed: Aug. 5, 2002

(65) Prior Publication Data

US 2002/0192942 A1 Dec. 19, 2002

Related U.S. Application Data

(63) Continuation of application No. 09/385,580, filed on Aug. 31, 1999, now Pat. No. 6,429,133.

(51) Int. Cl.[7] ............................................. H01L 21/302
(52) U.S. Cl. ...................... 438/692; 438/689; 438/697
(58) Field of Search ........................... 438/689, 692, 438/691, 693, 699

(56) References Cited

U.S. PATENT DOCUMENTS

| | | |
|---|---|---|
| 4,664,995 A | 5/1987 | Horgan et al. |
| 5,290,361 A | 3/1994 | Hayashida et al. |
| 5,366,542 A | 11/1994 | Yamada et al. |
| 5,692,950 A | 12/1997 | Rutherford et al. |
| 5,773,364 A | 6/1998 | Farkas et al. |
| 5,916,855 A | 6/1999 | Avanzino et al. |
| 5,954,997 A | 9/1999 | Kaufman et al. |
| 5,985,748 A | 11/1999 | Watts et al. |
| 6,039,633 A | 3/2000 | Chopra |
| 6,139,400 A | 10/2000 | Sato et al. |
| 6,213,845 B1 | 4/2001 | Elledge |
| 6,429,133 B1 * | 8/2002 | Chopra .................. 438/692 |

FOREIGN PATENT DOCUMENTS

| | | |
|---|---|---|
| DE | 3939661 | 6/1991 |
| JP | 03256665 | 11/1991 |
| WO | WO 98/06541 | 2/1998 |

OTHER PUBLICATIONS

Fang et al., "Determination of the Composition of Viscous Liquid Film on Electropolishing Copper Surface by XPS and AES," *J. Electrochem. Soc.*, 136(12), 3800–3803 (1989).

* cited by examiner

*Primary Examiner*—Matthew Smith
*Assistant Examiner*—Renzo N Rocchegiani
(74) *Attorney, Agent, or Firm*—Mueting, Raasch & Gebhardt, P.A.

(57) ABSTRACT

A planarization method includes providing an aluminum-containing surface and positioning it for contact with a fixed abrasive article in the presence of a composition preferably including a surfactant, a complexant, and an oxidant, wherein the solution has a pH of less than about 10.

69 Claims, 3 Drawing Sheets

COMPOSITION COMPATIBLE WITH ALUMINUM PLANARIZATION AND METHODS THEREFORE

This is a continuation of application Ser. No. 09/385,580, filed Aug. 31, 1999, now U.S. Pat. No. 6,429,133 which is incorporated herein by reference.

FIELD OF THE INVENTION

The present invention relates to a composition, preferably a solution, for planarization of aluminum surfaces in the fabrication of semiconductor devices. More particularly, the present invention relates to compositions compatible with fixed abrasive articles for use in planarization of aluminum surfaces and methods of using such compositions.

BACKGROUND OF THE INVENTION

During wafer fabrication of semiconductor devices, various surfaces are formed. Many of such surfaces do not have uniform height, and therefore, the wafer thickness is also non-uniform. Further, surfaces may have defects such as crystal lattice damage, scratches, roughness, or embedded particles of dirt or dust. For various fabrication processes to be performed, such as lithography and etching, height non-uniformities and defects at the surface of the wafer must be reduced or eliminated. Various planarization techniques are available to provide such reduction and/or elimination. One such planarization technique includes chemical-mechanical polishing (abbreviated herein as "CMP").

The method of CMP is used to achieve a planar surface over the entire chip and wafer, sometimes referred to as "global planarity." Conventionally, the process of CMP involves a wafer holder that holds a wafer. An abrasive slurry is applied so that it contacts the interface of the wafer and the polishing pad. A table or platen has a polishing pad thereon. The polishing pad is applied to the wafer at a certain pressure to perform the planarization. At least one of the wafer and a polishing pad are set in motion relative to the other. In some CMP processes, the wafer holder may or may not rotate, the table or platen may or may not rotate and/or the platen may be moved in a linear motion as opposed to rotating. There are numerous types of planarization units available which perform the process in different manners.

The use of abrasive slurries in wafer fabrication has proven problematic for several reasons. First, because abrasive slurries that contain a plurality of abrasive particles "in solution," tend to be unstable. In particular, not only do the abrasive particles settle, the abrasive particles also tend to agglomerate, both phenomenon resulting in a nonuniform slurry composition. This, in turn, creates wide variability in the polishing results. Second, it is known within the art that the composition of the slurry tends to be very specific with the desired chemical-mechanical polishing process, i.e., one slurry may not be suitable for a variety of CMP processes. Further, conventional CMP slurries typically do not work well with fixed abrasive CMP processes, for example, in aluminum surface planarization.

Further, conventional polishing pads also pose planarization difficulties. Such pads may glaze, or become embedded with debris, during polishing. This requires the pads to be conditioned such that the pads can be reused. Conditioning typically involves removal of the debris from the polishing pad using mechanical means with or without application of a solution. Conditioned pads typically leads to subsequent unpredictable CMP results because of the unpredictability in removal of debris from the pad itself during conditioning.

SUMMARY OF THE INVENTION

For the above reasons, there is a continuing need to provide a CMP using fixed abrasives and solutions compatible therewith in polishing aluminum. For example, conventional abrasive slurries are typically incompatible with fixed abrasive articles for CMP processes. This is particularly true with respect to aluminum-containing surface CMP processes, where aluminum can be present at about 50 atomic percent or more. The present invention as described below provides such improvements and overcomes the problems described above and those problems which will become apparent to one skilled in the art from the detailed description provided below.

One aspect of the present invention provides a composition compatible with a fixed abrasive article suitable for use in planarization of an aluminum-containing surface in the fabrication of semiconductor devices. Preferably, the composition is essentially abrasive particle-free from the stand point that the composition does not contain abrasive particles prior to its addition to the planarization process.

As used herein, "aluminum-containing surface" refers to an exposed region having aluminum present in an atomic amount of at least about 50% of the composition of the region, which may be provided as a layer, film, coating, etc. to be polishing, or planarized in accordance with the present invention. The surface may consist essentially of elemental aluminum or an aluminum alloy.

Another aspect of the present invention provides a planarization method that includes positioning an aluminum-containing surface of a wafer surface to interface with a fixed abrasive article; supplying an aluminum CMP composition in proximity to the interface; and planarizing the wafer surface using the fixed abrasive and the aluminum CMP composition, the aluminum CMP composition comprising a surfactant, a complexant, and an oxidant, wherein the composition has a pH of less than about 10.

Yet another aspect of the present invention provides a planarization method for use in forming an interconnect. Preferably, the method includes providing a wafer having a patterned dielectric layer formed thereon and an aluminum-containing layer formed over the patterned dielectric layer; positioning a fixed abrasive for contact with the aluminum-containing layer; providing a composition in proximity to the contact between the fixed abrasive and the metal layer, wherein the composition comprises a surfactant, a complexant, and about 0.5% to about 15% by volume of an oxidant, wherein the composition has a pH of less than about 10; and planarizing the aluminum-containing layer using the fixed abrasive and the composition.

Yet a further aspect of the present invention provides a planarization method including providing a substrate assembly including at least one region of a aluminum-containing metal; providing a fixed abrasive; providing a composition at an interface between the at least one region of aluminum-containing metal and the fixed abrasive, wherein the composition comprises a surfactant, a complexant, and an oxidant, wherein the composition has a pH of about 1 to about 10; and planarizing the at least one region of aluminum-containing metal using the fixed abrasive and the composition.

In one embodiment of any of the methods in accordance with the present invention, the composition preferably has a pH of less than about 7.0, more preferably from about 3.0 to about 5.0. In another embodiment of any of the methods above, the composition preferably has a pH of about 6.0 to about 8.0.

In any of the methods in accordance with the present invention, the aluminum-containing surface preferably aluminum in a molar amount of about 50% or more. The aluminum-containing surface may include elemental aluminum or it may include an aluminum alloy.

In any of the methods in accordance with the present invention, the fixed abrasive preferably includes a plurality of abrasive particles, wherein a majority of the plurality of abrasive particles include $SiO_2$. Preferably, the fixed abrasive comprises a majority of $SiO_2$ abrasive particles and the aluminum CMP composition has a pH of less than about 8.

In any of the methods in accordance with the present invention, the fixed abrasive includes an elongated fixed abrasive capable of planarizing the aluminum-containing surface on a first wafer with a first portion on the elongated fixed abrasive and an aluminum-containing surface on a second wafer with a second portion on the elongated fixed abrasive.

Any of the CMP methods in accordance with the present invention are preferably accomplished at a temperature of about 24° C. or less.

Preferably, the oxidant is present in the composition in an amount of about 0.5% to about 15% by volume, wherein the oxidant is preferably selected from the group consisting of $Fe(NO_3)_2$, $KMnO_4$, $H_2O_2$, $KNO_3$, $HNO_3$, $KIO_3$, ammonium persulfate, ammonium molybdate, and a combination thereof.

Preferably, the surfactant is present in the composition in an amount 1% to about 10% by volume wherein the surfactant is preferably selected from the group consisting of polyethylene glycol, polyoxyethylene ether, glycerol, polypropylene glycol, and a combination thereof.

Preferably, the complexant is present in the composition in an amount of about 1% to about 10% by weight, wherein the complexant is preferably selected from the group consisting of triethanolamine, ethylenediamine, ammonium citrate, ammonium phosphate, ammonium oxalate, ammonium carbonate, and a combination thereof.

The composition may further include an optional additive selected from the group consisting of a thickener, a buffering agent, and a combination thereof. If present, the thickener is in an amount sufficient to achieve a viscosity of the composition of about 10 centipoise to about 20 centipoise at ambient temperature. If present, the buffering agent can be selected from the group consisting of potassium hydrogen phthalate, ammonium salts (e.g., ammonium citrate, ammonium phosphate, and the like), and a combination thereof.

The composition may further include an aluminum corrosion inhibitor comprising from about 0.01% to about 2% by weight. Preferably, the aluminum corrosion inhibitor is selected from the group consisting of a phosphate, a polyphosphate, a silicate, and combination thereof.

Yet a further aspect of the present invention provides a composition consisting essentially of a surfactant in an amount of about 1% to about 10% by volume; a complexant in an amount of about 1% to about 10% by volume; and an oxidant in an amount of about 0.5% to about 15% by volume, wherein the composition has a pH of less than about 10 and is effective to planarize an aluminum-containing surface in the presence of a fixed abrasive. The composition may further include an optional agent selected from the group consisting of a buffering agent; a thickener; and a aluminum corrosion inhibitor.

As used herein, "surfactant" refers to a compound that reduces surface tension when dissolved in water or aqueous solutions, or which reduces interfacial tension between two liquids, or between a liquid and a solid. Conventional surfactants are categorized based on the nature of the solubilizing group found in the compound and are typically categorized as an anionic surfactant, a nonionic surfactant, a cationic surfactant, or an amphoteric surfactant.

As used herein, "complexant" refers to a compound containing at least one donor atom capable of combining with a metal ion to form a complex having properties different from those present in either the original complexant or ion, such as a cyclic structure.

As used herein, "oxidant" refers to a compound including at least one element from Group 1 of the Periodic Table combined with at least one oxygen atom.

As used herein, "abrasive article" and "fixed abrasive" each refer to a structure which includes a plurality of abrasive particles dispersed within a binder adhered to at least one surface of a backing material.

As used herein, "chemical-mechanical polishing" and "CMP" refer to a dual mechanism having both a chemical component and a mechanical component, wherein corrosion chemistry and fracture mechanics both play a roll in wafer polishing.

Another aspect of the present invention provides a method of using a fixed abrasive in a CMP process for semiconductor fabrication.

DESCRIPTION OF THE PREFERRED EMBODIMENTS

Figure 1A:
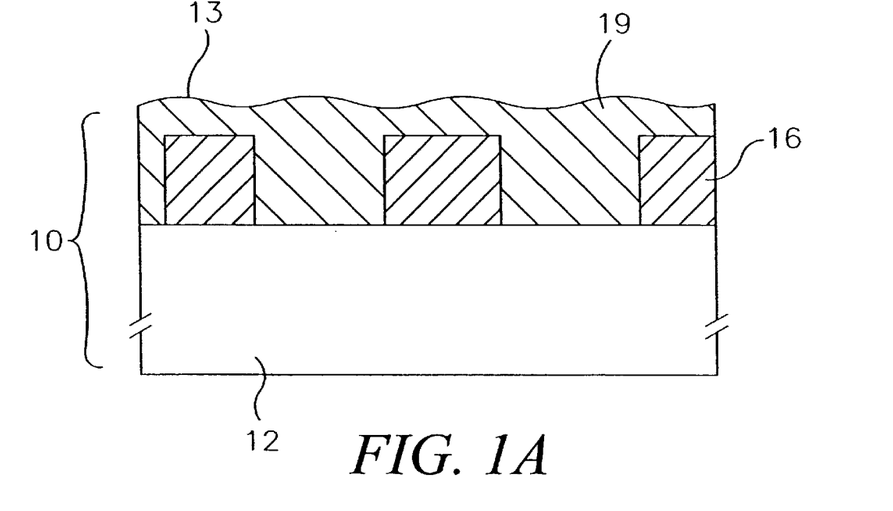
FIGS. 1A and 1B are cross-sectional illustrations of one portion of a wafer before and after a CMP process has been performed in accordance with the present invention.

FIG. 1A illustrates one portion of a wafer 10 prior to planarization by chemical-mechanical polishing (CMP) in accordance with the present invention. The wafer portion 10 includes a substrate assembly 12 having junctions 16 formed thereon. Isolation areas can also be formed on substrate assembly 12 having a patterned dielectric layer, e.g., an interlayer dielectric material, formed thereon that can be used, for example, in the formation of an interconnect structure.

As used herein, "substrate assembly" refers to a semiconductor substrate such as a base semiconductor layer or a semiconductor substrate having one or more layers, structures, or regions formed thereon. A base semiconductor layer is typically the lowest layer of silicon material on a wafer or a silicon layer deposited on another material, such as silicon on sapphire. When reference is made to a substrate assembly, various process steps may have been previously used to form or define regions, junctions, various structures or features, and openings such as vias, contact openings, high aspect ratio openings, conductive regions, contact regions, etc. For example, a substrate assembly may refer to a structure upon which a metallization is to be performed, e.g., metal lines are formed for electrical interconnection functionality.

The patterned dielectric layer may be formed of any layer providing electrical isolation between metal regions. For example, such a dielectric material may be a patterned oxide layer, e.g., silicon dioxide, TEOS (tetra ethyl orthosilicate).

An interconnect material 19 is then formed over the substrate assembly 12 and the patterned dielectric layer 16. The interconnect material 19 may be any conductive material such as aluminum, titanium, tungsten, copper, or any other suitable conductive interconnect material. One particularly preferred material is aluminum.

Generally, as shown in FIG. 1A, the nonplanar upper surface 13 of interconnect layer 19 is subjected to planarization in accordance with the present invention. The resulting wafer 10, as shown in FIG. 1B, includes an upper surface 17 planarized or polished such that the thickness of the wafer 10 is substantially uniform across the entire wafer 10 so that the wafer now includes electrically conductive regions 19, isolated within the patterned dielectric material 16 forming an interconnect layer 14, e.g., the conductive lines of the interconnect structure is separated by dielectric material.

Figure 1B:
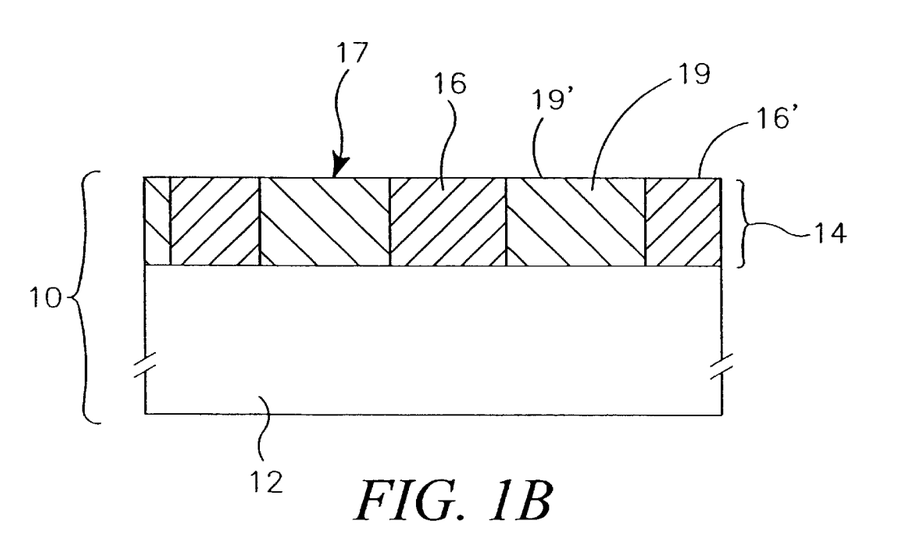

Further, as shown in FIG. 1B, the upper surface 17 of the interconnect layer 14 includes both dielectric material surface regions 16' and conductive surface regions 19' such that no conductive material 19 remains over the patterned dielectric layer 16.

FIG. 1A is shown only to illustrate a surface having nonuniformities, such as height differences, in the fabrication of semiconductor devices. Other surfaces, including but not limited to other conductive materials, various metal films, other doped oxides, spin on glasses, or any other fabricated surface which may require planarization as is known to one skilled in the art may benefit from the present invention. Therefore, the present invention is not limited to the planarization of any particular surface, but is limited only in accordance with the invention as described in the accompanying claims. However, the present invention is particularly beneficial in the planarization of metals such as aluminum in the formation of interconnect structures, e.g, such as in a Damascene flow as illustrated above with reference to FIG. 1A.

The present invention is not limited to use with nonplanar surfaces, such as that shown in FIG. 1A. The present invention is also beneficial for use with substantially planar surfaces. For example, the composition and method in accordance with the present invention is beneficial during the whole planarization process, even at the end of the process when the surface being planarized is in a substantially planar state. In fact, the present invention provides benefit for substantially planar surfaces as the composition of the present invention is preferably transported to the entire contact area between an abrasive article and the wafer. As such, the benefits are applicable to both nonplanar and planar surfaces and furthermore through the entire planarization process.

Figure 2:
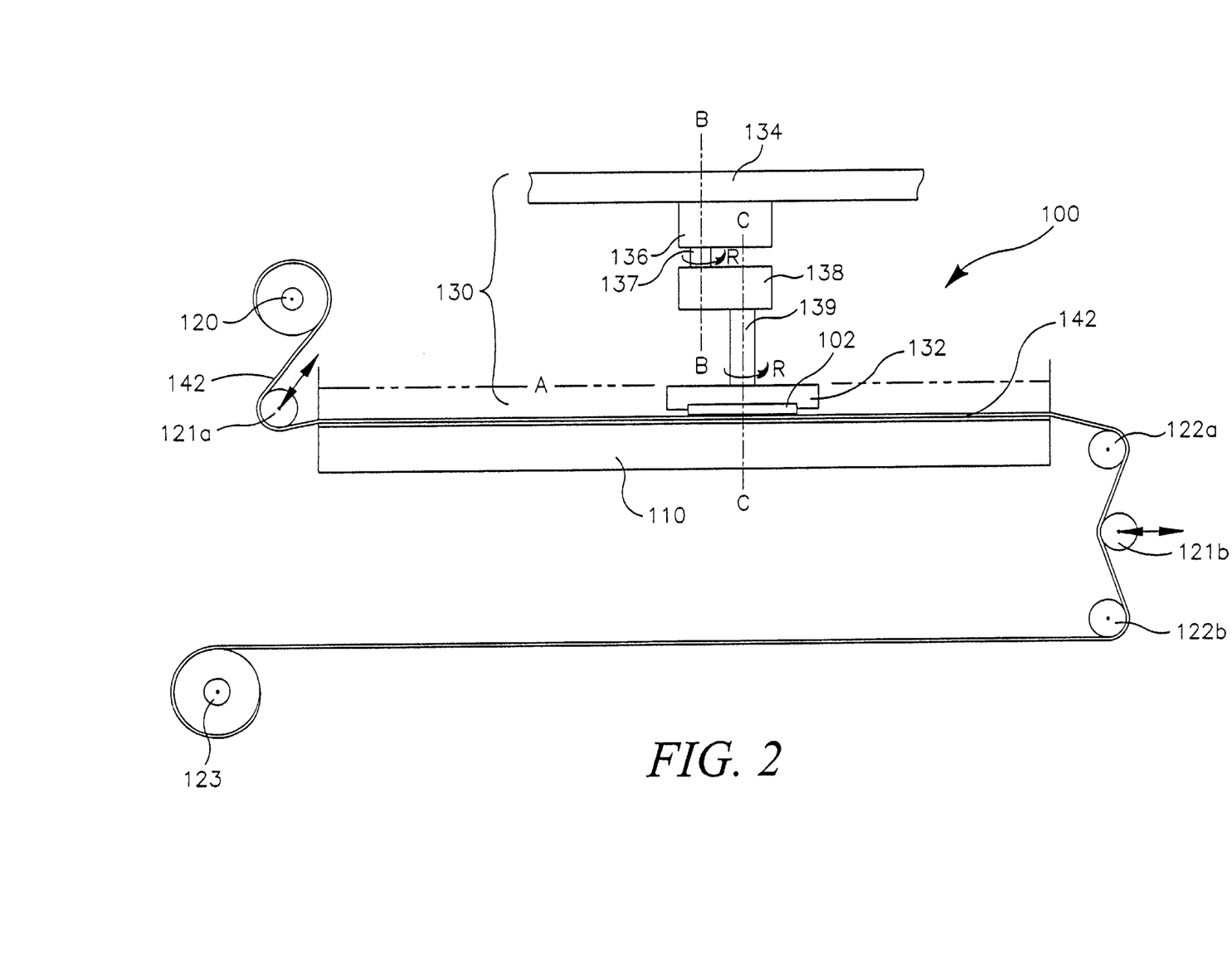
FIG. 2 is a general diagrammatical illustration of a chemical-mechanical polishing system utilized in accordance with the present invention.

FIG. 2 is a diagrammatical illustration showing one embodiment of a CMP system for planarization of surfaces of semiconductor wafers in accordance with the present invention. As shown in FIG. 2, the present invention utilizes a planarization assembly 100, which will be described below in more detail. Other planarization assemblies or units for performing CMP methods are readily available and are clearly contemplated by the scope of the present invention as described in the accompanying claims. Such planarization assemblies may create an interface between the fixed abrasive and the wafer in various configurations not specifically described herein, e.g., rotation, movement, pressure, etc., may be provided in numerous manners to achieve planarization using fixed abrasives.

One generally illustrated planarization assembly 100, as shown in FIG. 2, for performing CMP in accordance with the present invention, includes a revolving wafer holder or carrier portion 130 that holds wafer 102 of which wafer portion 10 (shown in FIGS. 1A and 1B) is a part thereof. A composition in accordance with the present invention is introduced at or near the interface between the abrasive article 142 and the wafer 102. A fixed abrasive 142 is then supplied between a platen 110 and the wafer 102.

As shown in FIG. 2, the fixed abrasive 142 may be supplied in a continuous manner, wherein a supply roll 120 feeds, via rollers 121a, 121b, 122a and 122b, an elongated fixed abrasive 142 to a polishing interface between the platen 110 and the wafer 102. After the polishing life of a portion of the fixed abrasive 142 has been exhausted, the fixed abrasive 142 can be advanced and is wound up on take-up roll 123. In one embodiment, the fixed abrasive 142 is advanced a distance that is preferably less than a maximum diameter of a wafer such that another wafer can be polished with an unused portion of the fixed abrasive. Preferably, the distance that the fixed abrasive is advanced is less than about 1.0% of the maximum diameter of a wafer. Alternatively, a fixed abrasive of a defined size may be attached to the platen 110 for use in a discrete manner, i.e., not continuous.

Optionally, a station (not shown) may be provided that can serve to pre-wet the fixed abrasive prior to planarization or it can serve to flush the fixed abrasive between the planarization of different wafers. The fixed abrasive 142 can be advanced to the station, located for example in close proximity to a rotating drum 122a and a solution is provided to the station which is then applied, such as by drip, spray, or other dispensing means, to the fixed abrasive surface that will ultimately contact the wafer. More preferably, the solution is an aqueous solution and, even more preferably, the solution is water or a composition in accordance with the present invention. After application of the solution, the fixed abrasive 142 is then positioned to contact the surface of the wafer for planarization.

The fixed abrasive 142 contacts a surface of the wafer 102 (e.g., the surface 13 of wafer 10 as depicted in FIG. 1A) in the presence of a composition in accordance with the present invention during the planarization process. Pressure can be applied, typically by a downward force applied to a carrier arm 139 affixed to holder 132, although a backside pressure can be applied from a platen 110 as contemplated by the present invention. Preferably, a method in accordance with the present invention is conducted at atmospheric pressure and at a temperature in a range from about 4° C. to about 62° C. In one embodiment, both a wafer holder 132 and/or the platen 110 can be revolved and moved by motors or drive means (134, 136, 137, 138) as is readily known to those skilled in the art.

Wafer holder portion 130 revolves wafer 102 at a selected velocity in a circular direction indicated by arrow "R" and moves wafer 102 under controlled pressure across a portion of the fixed abrasive 142. The wafer 102 contacts the fixed abrasive 142 as it is moved. The area of the fixed abrasive 142 which comes into contact with the surface of the wafer 102 varies as the wafer 102 is moved as is known to those skilled in the art. For example, the fixed abrasive 142 can be moved a distance that is less than a maximum diameter of a wafer such that a subsequently polished wafer is exposed to a second position on the fixed abrasive. Preferably, the second position on the fixed abrasive includes at least a portion that was not utilized to polish the wafer immediately preceding it. Thus, all or a portion of the second position on the fixed abrasive can include a portion that was not utilized to polish the wafer immediately preceding it. One suitable distance that the fixed abrasive 142 can be moved is less than about 1.0% of the maximum diameter of the wafer. Thus, for a wafer having a maximum diameter of about 8 inches (about 20.3 cm), a distance that the fixed abrasive 142 can be moved is about 0.25 inch (about 0.64 cm). Another suitable distance that the fixed abrasive 142 can be moved is a distance substantially equal to the maximum diameter of the wafer.

A supply system (not shown) introduces a composition in accordance with the present invention atop the fixed abrasive 142, preferably at or near the interface or contact area between the surface of the wafer 102 and the fixed abrasive 142 at a specified flow rate. The composition may be introduced at various locations about the fixed abrasive. For example, the composition may be introduced from above the fixed abrasive 142, such as by drip, spray, or other dispensing means.

Figure 3:
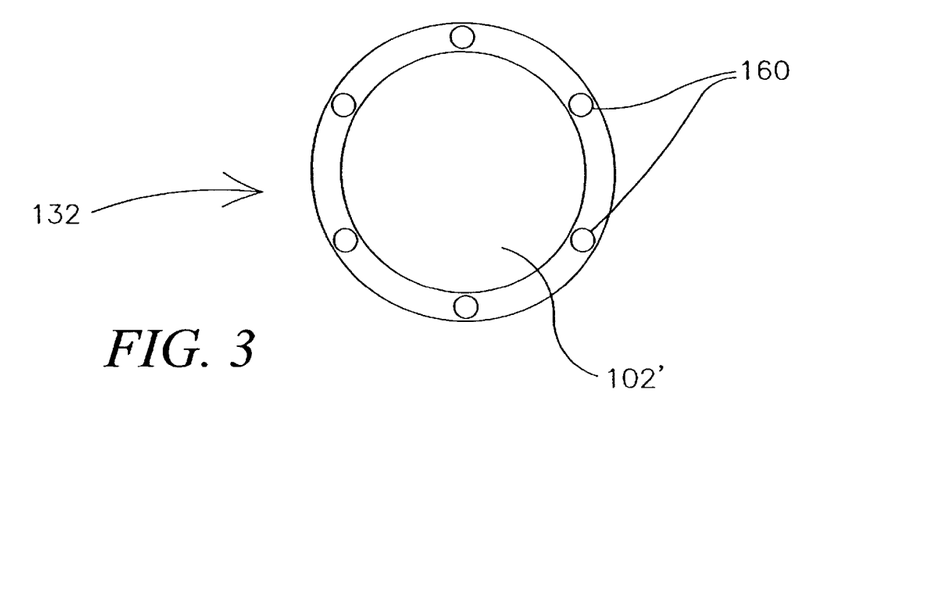
FIG. 3 is an enlarged cross-sectional view taken across line A—A of FIG. 2.

As shown in FIG. 3, taken across line A—A in FIG. 2, the composition may be introduced at or near the wafer/fixed abrasive interface by supplying the composition to a dispensing mechanism directly incorporated in the wafer bolder 132 of the wafer holder portion 130. A plurality of supply ports 160 are arranged around the periphery of the wafer holder through which the composition can be dispensed. The composition can be dispensed through all or a few of the supply ports at any given time during the planarization process. As shown in FIG. 3, on preferred arrangement of the plurality of supply ports 160 is about the circumference of a wafer attachment portion 102' of the wafer holder, although other arrangements are possible.

Figure 4:
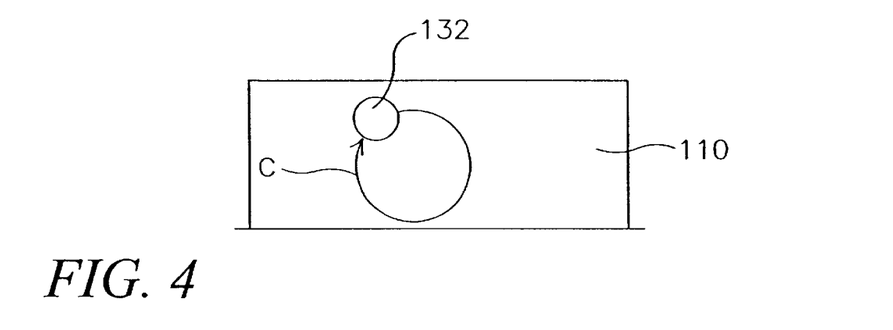
FIG. 4 is a schematic of one operation of a process in accordance with the present invention.

The wafer holder 132 is preferably revolved at a speed of about 200–600 mm/sec. As shown in FIG. 4, the wafer holder 132 preferably revolves in a path designated by arrow "C" in contact with platen 110 including the fixed abrasive 142. The speed of the wafer holder 132 is then related to the length of "C." The surface of the wafer 102 is held in juxtaposition relative to the fixed abrasive 142 so that the fixed abrasive 142 can planarize or polish the surface in combination with a composition in accordance with the present invention.

Although the foregoing has been described with particular attention to a revolving wafer holder, it is to be understood that for planarization both the wafer holder and the platen can move relative to one another. For example, the wafer holder can revolve/rotate and the platen can revolve or orbit. Further, either the wafer holder or the platen can be stationary.

A composition in accordance with the present invention is preferably added to the interface between the fixed abrasive and the wafer. A composition in accordance with the present invention for use in planarization, preferably planarization aluminum containing surfaces, preferably surfaces containing about a 50 molar % or more aluminum. Preferably, a composition in accordance with the present invention includes a surfactant, a complexant, and an oxidizer, wherein the composition has a pH of about 1 to about 10. More preferably, the composition is an aqueous solution of these components.

The surfactant component of the composition enhances wettability of the wafer surface prior to and during CMP. It is also believed to reduce friction between the wafer surface and the fixed abrasive during CMP and, thus, likely reduces the incidence of surface defects in the wafer. Preferably, the surfactant is present in the composition in an amount of about 1% to about 10% by volume. Preferably, the surfactant is selected from the group consisting of an anionic surfactant, a nonionic surfactant, a cationic surfactant, an amphoteric surfactant, and a combination thereof. Preferably, the surfactant is a anionic surfactant. More preferably, the surfactant is selected from the group consisting of polyethylene glycol, polyoxyethylene ether (such as that commercially available under the trade designation BRIJ, from ICI United States, Inc.), glycerol, polypropylene glycol, and a combination thereof.

The complexant is believed to complex with an ionic species of the aluminum being polished, typically aluminum oxide generated during CMP, from one another to prevent redeposition and agglomeration, both of which may result in surface defects if not prevented. The complexant is preferably present in the composition in an amount of about 1% to about 10% by weight and refers to a compound containing at least one donor atom capable of combining with a metal ion to form a complex having properties different from those present in either the original complexant or ion, such as a cyclic structure. A suitable complexant can be selected from the group consisting of triethanolamine, ethylenediamine, ammonium citrate, ammonium phosphate, ammonium oxalate, ammonium carbonate, and a combination thereof.

The oxidant is provided in the composition to aid in the planarization of an aluminum-containing surface using a fixed abrasive in accordance with the present invention. While not wishing to be bound by any particular theory, it is believed that the oxidant aids in the formation of aluminum oxides resulting in chemical oxidation of the metal surface during CMP. The aluminum layer might oxidize prior to removal or it may be removed from the wafer surface during the polishing and then is oxidized and/or dissolved in the composition thereafter. The oxidant is typically present in the composition in an amount of about 0.5% to about 15% by volume. Preferred oxidants are selected from the group consisting of $Fe(NO_3)_2$, $KMnO_4$, $H_2O_2$, $KNO_3$, $HNO_3$, $KIO_3$, ammonium persulfate, ammonium molybdate, and a combination thereof.

A composition in accordance with the present invention may also include a thickener to achieve a desired viscosity, typically in a range of about 10 centipoise to about 20 centipoise at ambient temperature. A suitable thickener includes that commercially available under the trade designation POLYOX, from Union Carbide, Danbury Conn. and that commercially available under the trade designation CARBOPOL from B. F. Goodrich, Cleveland, Ohio.

A composition in accordance with the present invention may also include a buffering agent present in an amount of about 0.1% to about 10% by weight. A suitable buffering agent can be selected from the group consisting of potassium hydrogen phthalate, ammonium salts (such as ammonium citrate, ammonium phosphate, and the like) and a combination thereof.

A composition in accordance with the present invention may further an aluminum corrosion inhibitor. It is believed that, if present, the corrosion inhibitor can protect the aluminum in low lying areas and improves CMP to from a generally planar surface. If present, the corrosion inhibitor is present in the composition in an amount of about 0.01% to about 2% by weight. Suitable examples of a corrosion inhibitor include phosphates, polyphosphates, silicates, and a combination thereof. For example, potassium hypophosphate and potassium silicate are particularly useful corrosion inhibitors.

It is to be understood that a composition in accordance with the present invention is preferably essentially free of abrasive particles when supplied to the interface of the fixed abrasive and the wafer surface. Thus, it is contemplated that polishing is accomplished by the composition in accordance with the present invention and one or both of the abrasive article and/or abrasive particles that may be removed from the fixed abrasive at the fixed abrasive/wafer surface interface. In any event, abrasive particles are not present in the composition as initially applied, i.e., they are not supplied from a source external to the polishing interface.

A suitable fixed abrasive for use in the present invention is known, such as that described in U.S. Pat. No. 5,692,950 (Rutherford, et al.) and International Patent Publication WO 98/06541. In general, a fixed abrasive includes a plurality of abrasive particles dispersed within a binder that forms a three-dimensional fixed abrasive element that is adhered to one surface of a backing material.

Preferably, planarizing aluminum in accordance with the present invention is conducted with soft abrasive particles, such as $SiO_2$, to reduce or avoid scratch or chatter marks from occurring on the polished aluminum surface. Further, pH is preferably kept in an acidic range (i.e., about 7.0 or less) to facilitate the planarization. It has been observed that in conventional CMP solutions and processes, $SiO_2$ abrasive particles do not remain well dispersed throughout a slurry composition in an acidic pH range. Consequently, harder abrasive particles are typically included in such a slurry that can result in scratches or chatter marks in the polished aluminum surface. Thus, fixed abrasive planarization using a composition in accordance with the present invention can be utilized so that softer abrasive particles can be incorporated into a CMP process at a pH of 7.0 or less.

Typically, planarization is preferably accomplished at a temperature of about 40° F. (about 4° C.) to about 145° F. (about 63° C.), however, in many instances, it would be desirable to maintain temperature at or below ambient temperature during aluminum planarization. Preferably the planarization is at a temperature of about 24° C. or less. Alternatively, the planarization is at a temperature of preferably about 23° C. (about 74° F.). This is seldom practical where lower slurry temperature likely results in poor abrasive particle dispersal through a slurry composition during planarization. Accordingly, elevated temperatures are typically utilized during planarization. However, in accordance with the present invention, the temperature may be maintained at or below ambient temperature, for example at about 65° F. (about 18° C.) or less. It is believed that at this temperature, the abrasive particles are fixed on the pad and agglomeration of abrasive particles does not generally occur.

All patents, patent documents, and publications cited herein are incorporated by reference as if individually incorporated. Although the invention has been described with particular reference to preferred embodiments thereof, variations and modifications of the present invention can be made within a contemplated scope of the following claims as is readily known to one skilled in the art.

What is claimed is:

1. A planarization method comprising:
   providing a wafer comprising an aluminum-containing surface;
   positioning the aluminum-containing surface to interface with a fixed abrasive article;
   supplying a planarization composition suitable for use with the aluminum-containing surface in proximity to the interface; and
   planarizing the surface using the fixed abrasive article and the planarization composition, the planarization composition comprising a surfactant, a complexant, and an oxidant, wherein the planarization composition has a pH less than about 10.

2. The method according to claim 1 wherein the surface of the wafer comprises aluminum in a molar amount of about 50% or more.

3. The method according to claim 1, wherein the planarization composition has a pH less than about 7.0.

4. The method according to claim 1, wherein the planarization composition has a pH of about 6.0 to about 8.0.

5. The method according to claim 1, wherein the oxidant is present in the planarization composition in an amount of about 0.5% to about 15% by volume.

6. The method according to claim 5, wherein the oxidant is selected from the group consisting of $Fe(NO_3)_2$, $KMnO_4$, $H_2O_2$, $KNO_3$, $HNO_3$, $KIO_3$, ammonium persulfate, ammonium molybdate, and a combination thereof.

7. The method according to claim 1, wherein the surfactant is present in the planarization composition in an amount 1% to about 10% by volume.

8. The method according to claim 7, wherein the surfactant is selected from the group consisting of polyethylene glycol, polyoxyethylene ether, glycerol, polypropylene glycol, and a combination thereof.

9. The method according to claim 1, wherein the complexant is present in the planarization composition in an amount of about 1% to about 10% by weight.

10. The method according to claim 9, wherein the complexant is selected from the group consisting of triethanolamine, ethylenediamine, ammonium citrate, ammonium phosphate, ammonium oxalate, ammonium carbonate, and a combination thereof.

11. The method according to claim 1, wherein the aluminum-containing surface comprises elemental aluminum.

12. The method according to claim 1, wherein the surface comprises an aluminum alloy.

13. The method according to claim 1, wherein the planarization composition further comprises a thickener in an amount sufficient to achieve a viscosity of the planarization composition of about 10 centipoise to about 20 centipoise at ambient temperature.

14. The method according to claim 1, wherein the planarization composition further comprises a buffering agent selected from the group consisting of potassium hydrogen phthalate, ammonium citrate, ammonium phosphate, and a combination thereof.

15. The method according to claim 1, wherein the planarization composition further comprises an aluminum corrosion inhibitor comprising from about 0.01% to about 2% by weight.

16. The method according to claim 15, wherein the aluminum corrosion inhibitor is selected from the group consisting of a phosphate, a polyphosphate, a silicate, and combination thereof.

17. The method according to claim 1, wherein the fixed abrasive article comprises a plurality of abrasive particles, wherein a majority of the plurality of abrasive particles comprise $SiO_2$.

18. The method according to claim 1, wherein the fixed abrasive article comprises a majority of $SiO_2$ abrasive particles and the planarization composition has a pH less than about 8.

19. The method according to claim 1, wherein the fixed abrasive article comprises an elongated fixed abrasive capable of planarizing the surface of a first wafer with a first portion of the elongated fixed abrasive and surface of a second wafer with a second portion of the elongated fixed abrasive.

20. A planarization method for use in forming an interconnect:
   providing a wafer having a patterned dielectric layer formed thereon and an aluminum-containing layer formed over the patterned dielectric layer;
   positioning a first portion of a fixed abrasive for contact with the aluminum-containing layer;
   providing a planarization composition for use with the aluminum-containing layer in proximity to the contact between the fixed abrasive and the aluminum-containing layer, wherein the planarization composition comprises a surfactant, a complexant, and about 0.5% to about 15% by volume of an oxidant, wherein the planarization composition has a pH less than about 10; and
   planarizing the aluminum-containing layer using the fixed abrasive and the planarization composition.

21. The method according to claim 20, wherein the aluminum-containing layer of the wafer comprises aluminum in a molar amount of about 50% or more.

22. The method according to claim 20, wherein the planarization composition has a pH less than about 7.0.

23. The method according to claim 20, wherein the planarization composition has a pH of about 6.0 to about 8.0.

24. The method according to claim 20, wherein the oxidant is selected from the group consisting of $Fe(NO_3)_2$, $KMnO_4$, $H_2O_2$, $KNO_3$, $HNO_3$, $KIO_3$, ammonium persulfate, ammonium molybdate, and a combination thereof.

25. The method according to claim 20, wherein the surfactant present in the planarization composition in an amount 1% to about 10% by volume.

26. The method according to claim 25, wherein the surfactant is selected from the group consisting of polyethylene glycol, polyoxyethylene ether, glycerol, polypropylene glycol, and a combination thereof.

27. The method according to claim 20, wherein the complexant is present in the planarization composition in an amount of about 1% to about 10% by weight.

28. The method according to claim 27, wherein the complexant is selected from the group consisting of triethanolamine, ethylenediamine, ammonium citrate, ammonium phosphate, ammonium oxalate, ammonium carbonate, and a combination thereof.

29. The method according to claim 20, wherein the aluminum-containing layer comprises elemental aluminum.

30. The method according to claim 20, wherein the aluminum-containing layer comprises an aluminum alloy.

31. The method according to claim 20, wherein the planarization composition further comprises a thickener in an amount sufficient to achieve a viscosity of the planarization composition of about 10 centipoise to about 20 centipoise at ambient temperature.

32. The method according to claim 20, wherein the planarization composition further comprises a buffering agent selected from the group consisting of hydrogen phthalate, ammonium citrate, ammonium phosphate, and a combination thereof.

33. The method according to claim 20, wherein the planarization composition further comprises an aluminum corrosion inhibitor selected from the group consisting of a phosphate, a polyphosphate, a silicate, and combination thereof.

34. The method according to claim 20, wherein the fixed abrasive comprises a plurality of abrasive particles, wherein a majority of the plurality of abrasive particles comprise $SiO_2$.

35. The method according to claim 20, wherein the fixed abrasive comprises a majority of $SiO_2$ abrasive particles and the planarization composition has a pH less than about 8.0.

36. The method according to claim 20, wherein planarizing is accomplished at a about 24° C. or less.

37. The method according to claim 20, wherein the fixed abrasive comprises an elongated fixed abrasive capable of planarizing the aluminum-containing layer on a first wafer with the first portion on the elongated fixed abrasive and an aluminum-containing layer on a second wafer with a second portion on the elongated fixed abrasive.

38. A planarization method comprising:
   providing a substrate assembly comprising at least one aluminum-containing surface region;
   providing a fixed abrasive;
   providing a planarization composition at an interface between the at least one surface region and the fixed abrasive suitable for use with the at least one surface region, wherein the planarization composition comprises a surfactant, a complexant, and an oxidant, wherein the planarization composition has a pH less than about 10; and
   planarizing the at least one surface region using the fixed abrasive and the planarization composition.

39. The method according to claim 38, wherein the at least one surface region comprises aluminum in a molar amount of about 50% or more.

40. The method according to claim 38, wherein the planarization composition has a pH less than about 7.0.

41. The method according to claim 38, wherein the planarization composition has a pH of about 6.0 to about 8.0.

42. The method according to claim 38, wherein the oxidant is present in the planarization composition in an amount of about 0.5% to about 15% by volume.

43. The method according to claim 42, wherein the oxidant is selected from the group consisting of $Fe(NO_3)_2$, $KMnO_4$, $H_2O_2$, $KNO_3$, $HNO_3$, $KIO_3$, ammonium persulfate, ammonium molybdate, and a combination thereof.

44. The method according to claim 38, wherein the surfactant is present in the planarization composition in an amount 1% to about 10% by volume.

45. The method according to claim 44, wherein the surfactant is selected from then group consisting of polyethylene glycol, polyoxyethylene ether, glycerol, polypropylene glycol, and a combination thereof.

46. The method according to claim 38, wherein the complexant is present in the planarization composition in an amount of about 1% to about 10% by weight.

47. The method according to claim 46, wherein the complexant is selected from the group consisting of triethanolamine, ethylenediamine, ammonium citrate, ammonium phosphate, ammonium oxalate, ammonium carbonate, and a combination thereof.

48. The method according to claim 38, wherein the at least one surface region comprises elemental aluminium.

49. The method according to claim 38, wherein the at least one surface region comprises an aluminum alloy.

50. The method according to claim 38, wherein the planarization composition further comprises a thickener in an amount sufficient to achieve a viscosity of the planarization composition of about 10 centipoise to about 20 centipoise at ambient temperature.

51. The method according to claim 38, wherein the planarization composition further comprises a buffering agent selected from the group consisting of potassium hydrogen phthalate, ammonium citrate, ammonium phosphate, and a combination thereof.

52. The method according to claim 38, wherein the planarization composition further comprises an aluminum corrosion inhibitor selected from the group consisting of a phosphate, a polyphosphate, a silicate, and combination thereof.

53. The method according to claim 38, wherein the fixed abrasive comprises a plurality of abrasive particles, wherein a majority of the plurality of abrasive particles comprise $SiO_2$.

54. The method according to claim 38, wherein the fixed abrasive comprises a majority of $SiO_2$ abrasive particles and the planarizing composition has a pH less than about 8.0.

55. The method according to claim 38, wherein planarizing is accomplished at a temperature of about 24° C. or less.

56. The method according to claim 38, wherein the fixed abrasive comprises an elongated fixed abrasive capable of planarizing the at least one aluminum-containing surface region of a first substrate assembly with a first portion of the elongated fixed abrasive and a second aluminum-containing surface region of a second substrate assembly with a second portion of the elongated fixed abrasive.

57. The method according to claim 56, wherein the planarization composition comprises at least one of an optional agent selected from the group consisting of a buffering agent; a thickener; and an aluminum corrosion inhibitor.

58. A planarization method comprising:
providing a wafer comprising an aluminum-containing surface;
locating the surface of the wafer to interface with a fixed abrasive article;
providing a planarization composition suitable for use with the surface in proximity to the interface; and
planarizing the surface using the fixed abrasive article and the planarization composition, wherein planarizing the surface comprises planarizing the surface at a temperature of about 24° C. or less, wherein the planarization composition comprises a surfactant, a complexant, and an oxidant, and further wherein the planarization composition has a pH less than about 10.

59. The method according to claim 58, wherein the surface of the wafer comprises aluminum in a molar amount of about 50% or more.

60. The method according to claim 58, wherein the planarization composition as a pH of about 6.0 to about 8.0.

61. The method according to claim 58, wherein the oxidant is present in the planarization of about 0.5% to about 15% by volume.

62. The method according to claim 58, wherein the surfactant is present in the planarization composition in an amount 1% to about 10% by volume.

63. The method according to claim 58, wherein the complexant is present in the planarization composition in an amount of about 1% to about 10% by weight.

64. The method according to claim 58, wherein the surface comprises elemental aluminum.

65. The method according to claim 58, wherein the surface comprises an aluminum alloy.

66. The method according to claim 58, wherein the planarization composition further comprises a thickener in an amount sufficient to achieve a viscosity of the composition of about 10 centipoise to about 20 centipoise at ambient temperature.

67. The method according to claim 58, wherein the fixed abrasive article comprises a plurality of abrasive particles, wherein a majority of the plurality of abrasive particles comprise $SiO_2$.

68. The method according to claim 58, wherein the fixed abrasive article comprises a majority of $SiO_2$ abrasive particles and the planarization composition has a pH less than about 8.

69. The method according to claim 58, wherein the fixed abrasive article comprises an elongated fixed abrasive capable of planarizing the aluminum-containing surface of a first wafer with a first portion of the elongated fixed abrasive and aluminum-containing surface comprising aluminum of a second wafer with a second portion of the elongated fixed abrasive.

* * * * *